United States Patent [19]

Kiko

BEST AVAILABLE COPY

[11] E Re. 29,080

[45] Reissued* Dec. 14, 1976

[54] COMPENSATED TRANSFORMER CIRCUIT UTILIZING NEGATIVE CAPACITANCE SIMULATING CIRCUIT

[75] Inventor: Frederick J. Kiko, Sheffield Village, Ohio

[73] Assignee: Lorain Products Corporation, Lorain, Ohio

[ * ] Notice: The portion of the term of this patent subsequent to May 6, 1992, has been disclaimed.

[22] Filed: June 2, 1975

[21] Appl. No.: 582,858

Related U.S. Patent Documents

Reissue of:

[64] Patent No.: 3,832,654
Issued: Aug. 27, 1974
Appl. No.: 426,826
Filed: Dec. 20, 1973

[52] U.S. Cl. ..... 333/24 R; 333/80 R; 323/44 R; 323/48

[51] Int. Cl.[2] ..... H03H 7/00; H03H 11/00

[58] Field of Search ..... 323/6, 44 R, 48, 60, 323/112; 333/12, 17, 24 R, 24 C, 80 R, 80 T; 336/69; 330/107, 109

[56] References Cited

UNITED STATES PATENTS

| | | | |
|---|---|---|---|
| 2,891,214 | 6/1959 | Rogers et al. | 323/44 R |
| 2,944,207 | 7/1960 | Rogers et al. | 323/44 R |
| 3,013,225 | 12/1961 | Ouchi | 333/80 R X |
| 3,474,355 | 10/1969 | Schlichte | 333/80 R |
| 3,546,565 | 12/1970 | Downing, Jr. et al. | 323/48 X |
| 3,684,948 | 8/1972 | Eissmann | 323/48 X |
| 3,828,281 | 8/1974 | Chambers, Jr. | 333/17 R |
| 3,881,149 | 4/1975 | Kiko | 323/6 |

*Primary Examiner*—Paul L. Gensler
*Attorney, Agent, or Firm*—Edward C. Jason

[57] ABSTRACT

A circuit for reducing or eliminating the effect of the stray capacitance of the windings of a transformer on signals coupled through that transformer. Circuitry is provided for generating voltages and currents which simulate the presence of a negative capacitance and for coupling those voltages and currents to a transformer in cancelling relationships to the stray capacitance thereof. Circuitry is also provided for imposing an upper frequency limit beyond which capacitance cancellation will not occur. The upper frequency limit stabilizes the circuitry and allows signal transmission to be limited to a predetermined desired band of frequencies.

11 Claims, 15 Drawing Figures

COMPENSATED TRANSFORMER CIRCUIT UTILIZING NEGATIVE CAPACITANCE SIMULATING CIRCUIT

Matter enclosed in heavy brackets[ ]appears in the original patent but forms no part of this reissue specification; matter printed in italics indicates the additions made by reissue.

BACKGROUND OF THE INVENTION

The present invention relates to compensating circuits for transformers and is directed more particularly to circuits for reducing the effect of stray capacitance on signal transmission through transformers.

Because of their usefulness in providing isolation, impedance matching and voltage and current transformations, transformers have become widely used in circuits such as voice-frequency amplifiers. In a voice-frequency amplifier circuit such as, for example, that described in the U.S. Pat. of Charles W. Chambers, Jr., No. 3,706,862, entitled "Amplifier Circuit For Transmission Lines," transformers play a useful role in coupling the amplifier circuitry in series with and across a telephone line.

One serious problem with utilizing transformers for coupling voice-frequency signals is that the windings thereof exhibit a stray, distributed capacitance between the turns of the windings thereof. This stray capacitance causes a portion of the driving signal current to traverse the terminals of the primary winding without inducing corresponding currents in the secondary windings, particularly at the high end of the transmission band. The presence of this stray capacitance has been found to worsen the impedances of transmission lines which include such transformers.

Prior to the present invention it has been the practice to minimize the effect of stray capacitance by utilizing transformers having winding configurations which minimize the distributed capacitance between the turns. The improvement which could be effected in this manner was, however, quite limited and not subject to change once the transformer was made. In addition, such improvements could not be made in existing transformers.

In accordance with the present invention, there is provided capacitance compensating circuitry which improves the high frequency response of transformers having ordinary core materials and ordinary winding configurations. More specifically, the compensating circuitry of the invention is adapted to substantially cancel the stray capacitance of transformers and thereby extend the band of frequencies which may be coupled through the transformer without significant frequency dependent effects. In addition, the circuit of the invention is adapted to allow the desired capacitance cancellation to occur over a controllable band of frequencies extending far beyond that normally provided by ordinary transformers and to suppress that capacitance cancellation for signal frequencies outside of the desired band.

SUMMARY OF THE INVENTION

It is an object of the invention to provide circuitry for improving the signal distortion characteristics of ordinary transformers.

Another object of the invention is to provide compensating circuitry for substantially reducing or eliminating the effect of frequency dependent current flow through the stray capacitance of transformer windings.

Yet another object of the invention is to provide circuitry which substantially cancels the effect of the stray, distributed capacitance of the windings of transformers.

Still another object of the invention is to provide circuitry of the above character including circuitry for suppressing capacitance cancellation at frequencies beyond the band in which capacitance cancellation is desirable.

Another object of the invention is to provide circuitry of the above character which can be used in existing transformers.

DESCRIPTION OF THE INVENTION

Figure 1:
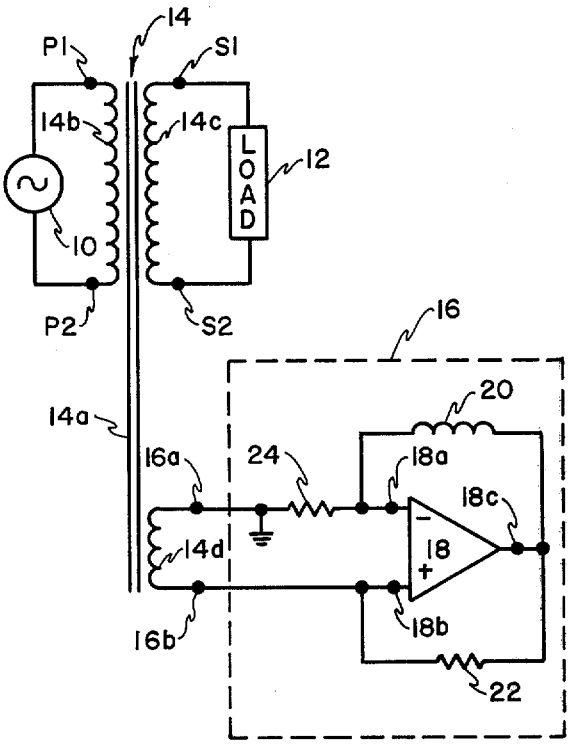
FIGS. 1, 1a and 1b are schematic diagrams of one illustrative embodiment of the compensated transformer circuit of the invention, FIGS. 2, 2a and are schematic diagrams showing a second embodiment of the compensated transformer circuit of the invention.

Referring to FIG. 1 there is shown a source of a-c voltage 10 for energizing a load 12 through a transformer 14. Source 10 may, for example, comprise a transmission line which is energized by a remote voice-frequency source and load 12 may comprise a repeater circuit which amplifies the transmission of signals through that transmission line. In transmission line-repeater systems of this type, a transformer such as 14 is desirable to electrically isolate the repeater circuit from the transmission line and vice-versa.

In the present embodiment, transformer 14 comprises a suitable magnetic core 14a around which are disposed a primary winding 14b, a secondary winding 14c and a tertiary or auxiliary winding 14d. Because of the adjacency of the turns of windings 14b and 14c, transformer 14 exhibits a stray capacitance which may be visualized as a first lumped capacitance connected between primary winding terminals P1 and P2 and a second lumped capacitance connected between secondary winding terminals S1 and S2. Alternatively, the lumped, stray capacitance may be visualized entirely across primary winding terminals P1 and P2 or entirely across secondary winding terminals S1 and S2. The effect of this stray capacitance is to shunt signal current across the turns of the primary and secondary windings and thereby reduce the percentage of the signal from source 10 that is transformed in transformer 14. The magnitude of the current through the stray capacitance is ordinarily so low in the low and middle frequency regions of, for example, the voice-frequency band that the effect thereof may be neglected. At the high end of the voice-frequency band, however, the current through the stray capacitance is substantial and prevents an appreciable portion of the high frequency components of the signal from affecting load 12. This condition results in signal distortion and, in the case of use in a transmission line, in a worsening of the impedance of the transmission line.

To the end that the effects of the stray capacitance of transformer 14 may be substantially reduced or eliminated, there is provided a capacitance simulating network 16 which, in the embodiment of FIG. 1, is coupled to transformer 14 through tertiary winding 14d. As will be described more fully presently, simulating network 16 serves to establish at terminals 16a and 16b thereof, voltages and currents which effectively cancel the stray capacitance of transformer 14. As a result, simulating network 16 allows signal transmission through transformer 14 to proceed as if that transformer had no stray capacitance and thereby greatly reduces the distortion of the high frequency components of the signal.

In accordance with one feature of the present invention, the desired capacitance cancellation is produced by simulating between terminals 16a and 16b the presence of a negative capacitance having a magnitude which, through winding 14d, approximately equals the real stray capacitance of transformer 14. The result of applying this simulated negative capacitance to transformer 14 is that the negative or simulated capacitance combines in parallel with the positive or real stray capacitance, according to the usual parallel combination rules, to generate an equivalent combined capacitance having a value approximately equal to zero. The latter condition effectively prevents transformer 14 from affecting the high frequency components of signal transmission from source 10 to load 12.

In the present embodiment, simulating network 16 includes an operational amplifier 18 having an inverting input 18a, a noninverting input 18b, and an output 18c. Simulating network 16 also includes feedback means comprising a negative feedback impedance here shown as an inductor 20 connected between amplifier output 18c and inverting amplifier input 18a, a positive feedback impedance here shown as a resistor 22 connected between amplifier output 18c and non-inverting amplifier input 18b, and an input feedback impedance here shown as a resistor 24 connected between input terminal 16a and inverting amplifier input 18a. The relationship governing the magnitude of the impedance $Z_{in}$ looking into terminals 16a and 16b of this type of circuit, that is, a circuit wherein the input feedback impedance is connected to the inverting amplifier input is given by the formula $Z_{in}=-Z_2 \cdot Z_3/Z_1$, where $Z_1$ is the negative feedback impedance, $Z_2$ is the input feedback impedance and $Z_3$ is the positive feedback impedance. This relationship allows the values of inductor 20 and resistors 22 and 24 to be selected to afford the necessary value of negative capacitance.

Figure 1A:
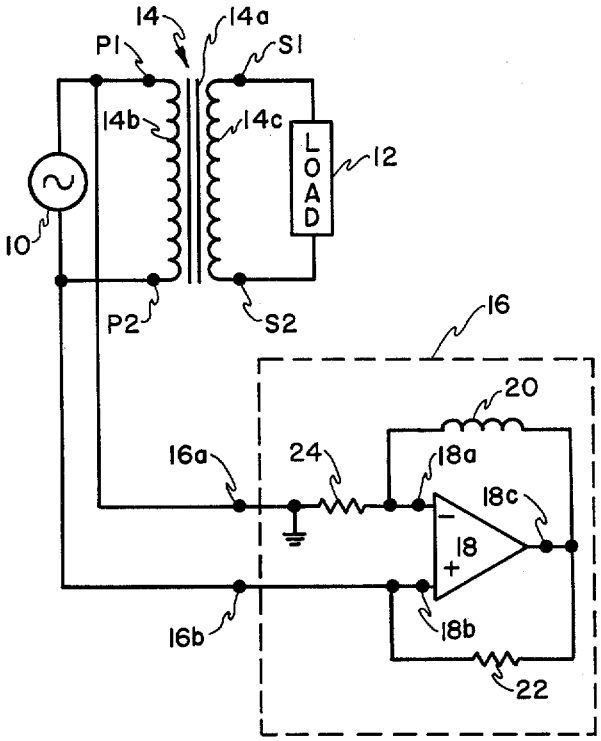
Figure 1B:
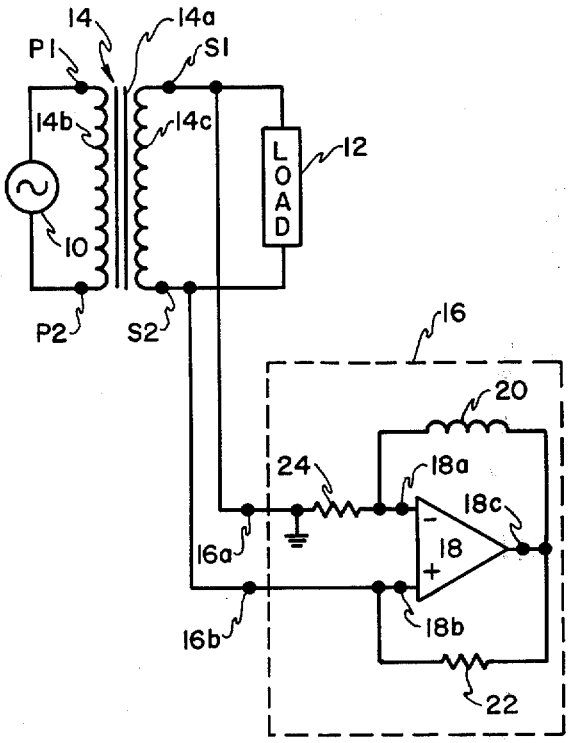

In the event that it is desirable to provide stray capacitance cancellation in transformers which do not have a tertiary winding as, for example, where it is desirable to add the compensating circuit of the invention to an existing two-winding transformer, this may be accomplished by connecting simulating network 16 to the existing transformer in the manner shown in FIG. 1a or 1b. The circuits of FIGS. 1a and 1b are generally similar to that of FIG. 1 and like functioning parts are similarly numbered. It will be understood, however, that the component values utilized in the circuits of FIGS. 1a and 1b are not necessarily the same as those utilized in the circuit of FIG. 1.

As shown in FIG. 1a, the input terminals of simulating network 16 may be connected across primary winding 14b of transformer 14. In this position, simulating network 16 operates in the manner described in connection with the circuit of FIG. 1 to substantially cancel the stray capacitance of transformer 14. Similarly, as shown in FIG. 1b, capacitance cancellation may be provided by connecting the input terminals of simulating network 16 across the secondary winding 14c of transformer 14. Thus, the circuit of the invention may be applied to existing two-winding transformers as well as to specially wound three-winding transformers.

Figure 4:
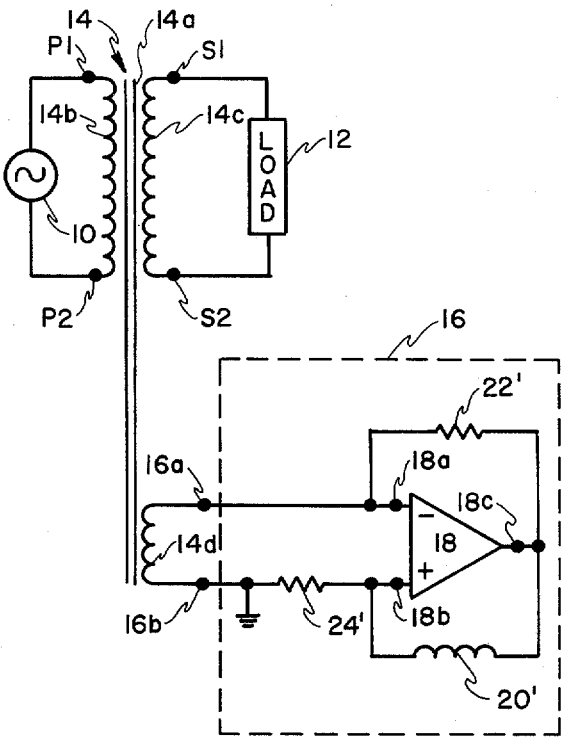
FIGS. 4, 5 and 6 are schematic diagrams of further embodiments of compensated transformer circuits of the invention.

The desired negative capacitance may also be realized with the feedback circuitry shown in FIG. 4. The circuit of FIG. 4 is similar to that of FIG. 1, like functioning parts being similarly numbered. The circuit of FIG. 4 differs from that of FIG. 1 primarily in that in FIG. 4 inductor 20' is a positive feedback element connected to non-inverting amplifier input 18b, resistor 22' is a negative feedback element connected to inverting amplifier input 18a and resistor 24' is an input feedback element connected to non-inverting amplifier input 18b. In circuits of the type shown in FIG. 4, that is, circuits wherein the input feedback impedance is connected to the non-inverting amplifier input, the relationship governing the magnitude of the impedance $Z_{in}$ looking into terminals 16a and 16b is given by the formula $Z_{in}=-Z_2 \cdot Z_1/Z_3$, where $Z_1$ is the negative feedback impedance, $Z_2$ is the input feedback impedance and $Z_3$ is the positive feedback impedance. Thus, capacitance simulating circuit 16 may be realized with an inductive reactance in either the negative or the positive feedback path. It will be understood that capacitance simulating circuit 16 of FIG. 4 may be coupled to transformer 14 by metallic connections across the primary or secondary winding, as shown in FIGS. 1a and 1b.

Figure 2:
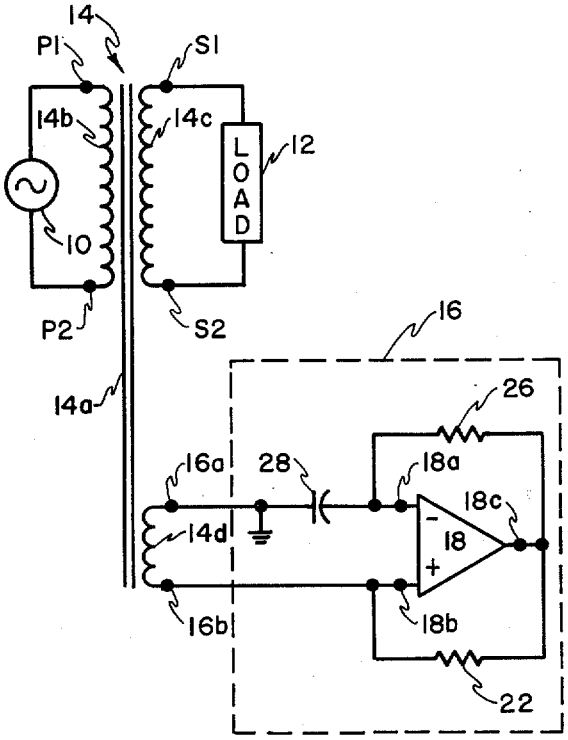

The circuit of FIG. 2 shows an embodiment of the invention in which capacitance cancellation is afforded without utilizing an inductor in the feedback path of amplifier 18. The circuit of FIG. 2 is generally similar to that of FIG. 1 and like functioning parts are similarly numbered. The circuit of FIG. 2 differs from that of FIG. 1 primarily in that in the circuit of FIG. 2 the simulation of negative capacitance between terminals 16a and 16b is accomplished by means of a capacitive reactance 28 connected in the input feedback path of amplifier 18, rather than by an inductive reactance in the negative feedback path of amplifier 18, as shown in FIG. 1. The effect produced by the circuit of FIG. 2 and the manner in which it is produced is, however, the same as that described in connection with the circuit of FIG. 1.

Figure 2A:
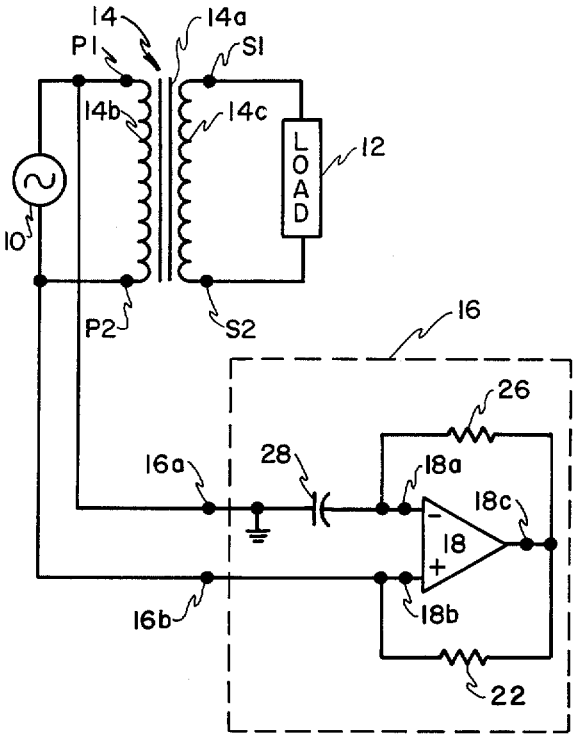
Figure 2B:
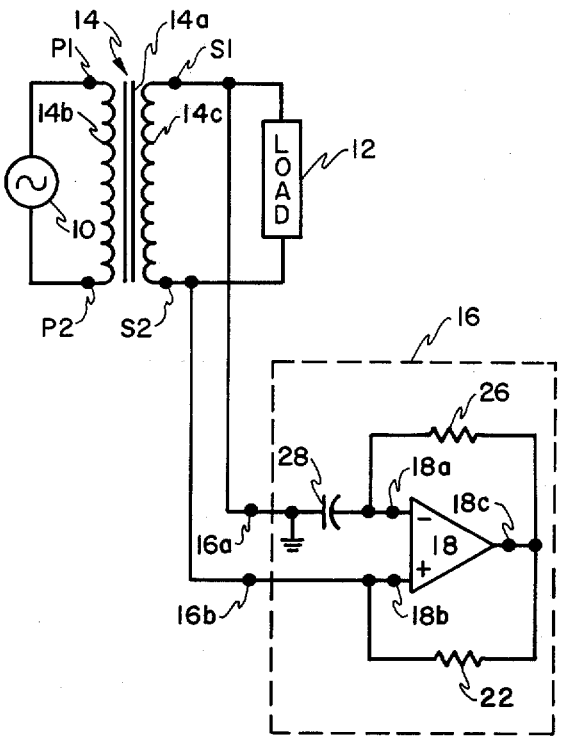

FIGS. 2a and 2b show embodiments of the invention wherein the simulating network of FIG. 2 is connected, respectively, across the primary and secondary windings of transformer 14. As in the case of FIGS. 1a and 1b, the primary and secondary winding connections shown in FIGS. 2a and 2b allow simulating network 16 to be applied to existing two-winding transformers. Thus, the circuits of FIGS. 2a and 2b bear the same relationship to the circuit of FIG. 2 that the circuits of FIGS. 1a and 1b bear to the circuit of FIG. 1.

Figure 5:
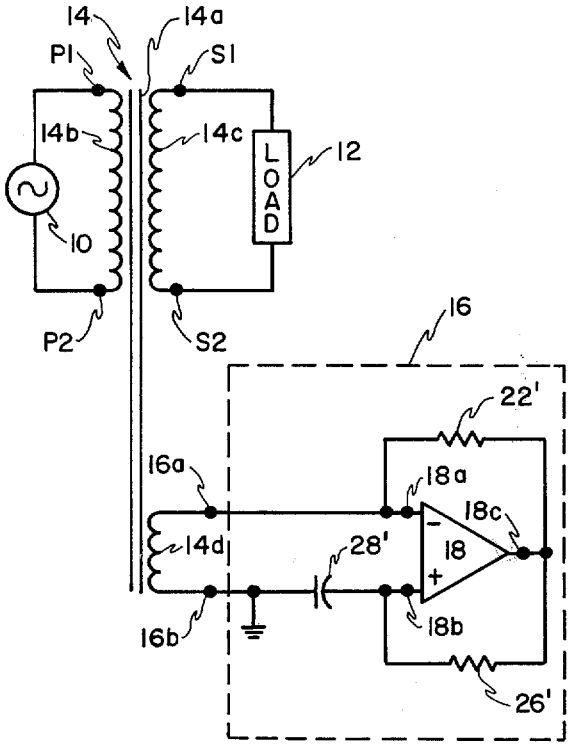

Referring to FIG. 5, there is shown another embodiment of the invention in which a capacitive input feedback impedance is utilized to simulate the desired negative capacitance between terminals 16a and 16b. The circuit of FIG. 5 is similar to that of FIG. 2 and like functioning parts are similarly numbered. The circuit of FIG. 5 differs from that of FIG. 2 primarily in that the input feedback capacitor 28' of FIG. 4 is connected to non-inverting amplifier input 18b rather than to inverting amplifier input 18a, as shown in FIG. 2. Thus, the circuit of FIG. 5 will be seen to bear the same relationship to the circuit of FIG. 2 that the circuit of FIG. 4 did to the circuit of FIG. 1. It will be understood that a circuit of the type shown in FIG. 5 may also be coupled to transformer 14 by metallic connections across the primary or secondary winding as shown in FIGS. 2a and 2b.

Figure 3:
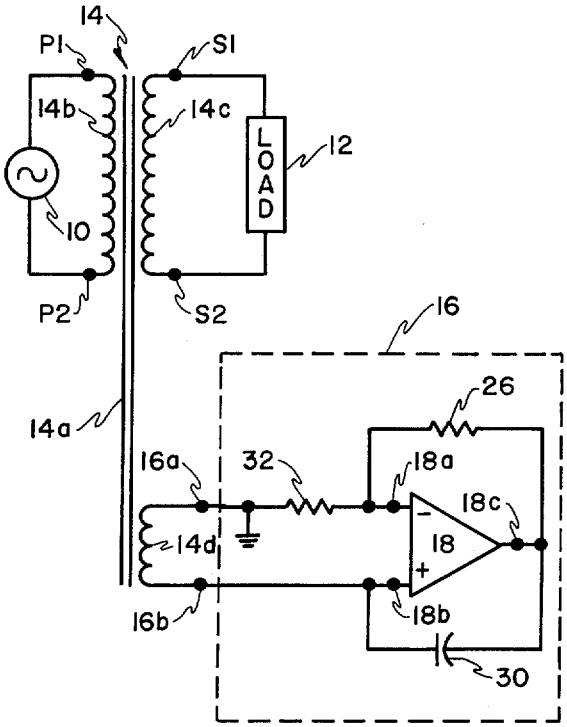
FIGS. 3, 3a and 3b are schematic diagrams of a third embodiment of the compensated transformer circuit of the invention.

The circuit of FIG. 3 shows an embodiment of the invention in which capacitance cancellation is afforded by a simulating network having a capacitor 30 in the positive feedback path of amplifier 18 and resistors 26 and 32 in the respective negative and input feedback paths thereof. The effect produced by simulating network 16 of FIG. 3 and the manner in which that effect is produced is, however, the same as that described in connection with the circuit of FIG. 1.

Figure 3A:
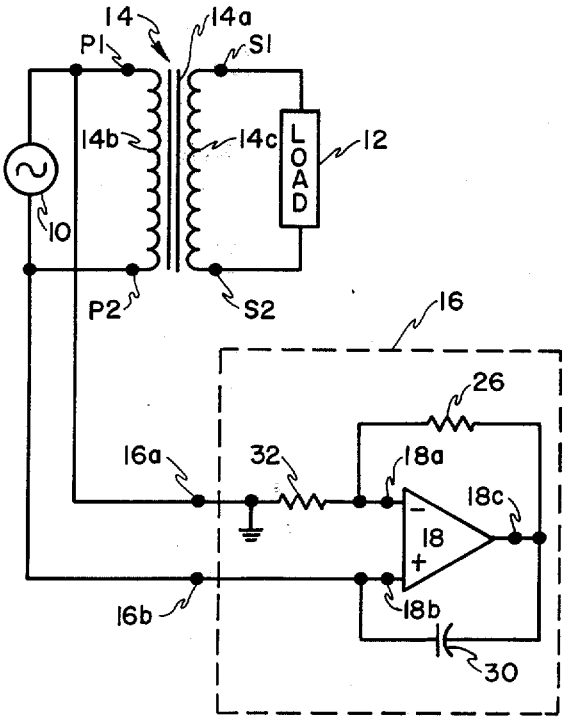
Figure 3B:
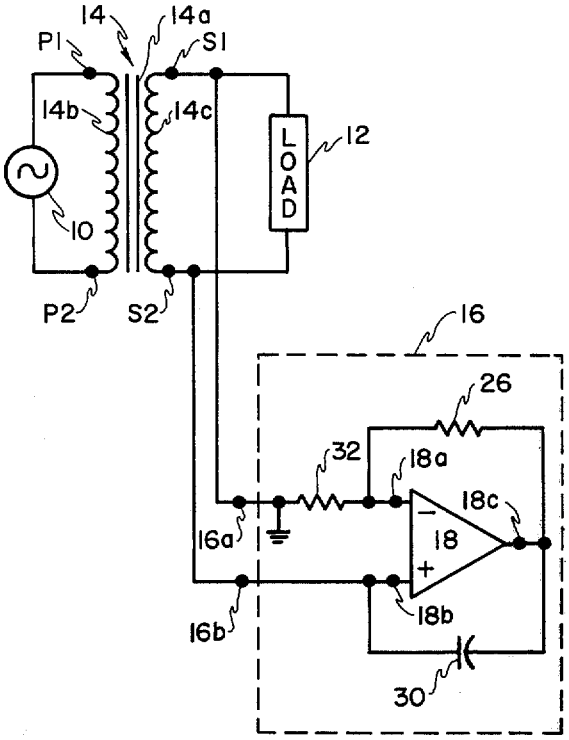

FIGS. 3a and 3b, show embodiments of the invention wherein the simulating network of FIG. 3 is connected, respectively, across the primary and secondary windings of transformer 14. As in the cases of FIGS. 1a and 1b, and 2a and 2b, the primary and secondary winding connections shown in FIGS. 3a and 3b allow simulating network 16 to be applied to existing two-winding transformers. Thus, the circuits of FIGS. 3a and 3b bear the same relationship to the circuit of FIG. 3 that the circuits of FIGS. 1a and 1b, and 2a and 2b bear to the circuits of FIGS. 1 and 2, respectively.

Figure 6:
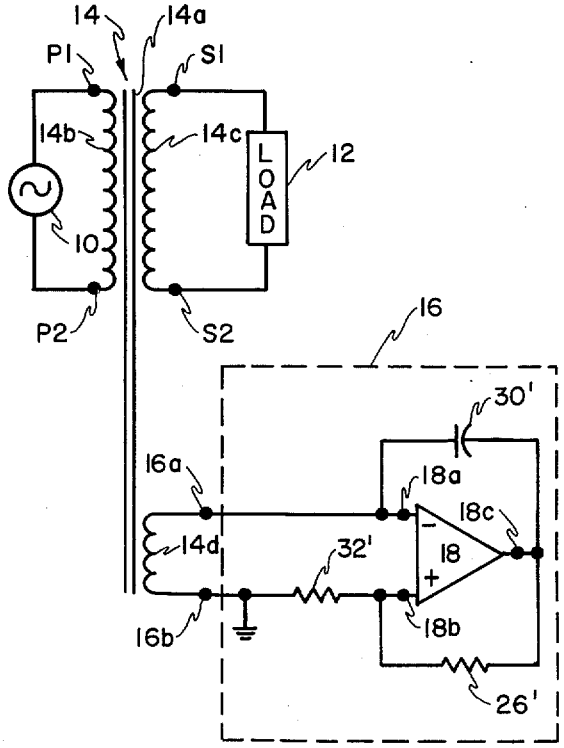

Referring to FIG. 6, there is shown another embodiment of the invention in which a capacitive feedback impedance is utilized to simulate the desired negative capacitance between terminals 16a and 16b. The circuit of FIG. 6 is similar to that of FIG. 3 and like functioning parts are similarly numbered. The circuit of FIG. 6 differs from that of FIG. 3 primarily in that capacitor 30' of FIG. 6 is connected in the negative feedback path of amplifier 18 rather than in the positive feedback path of amplifier 18, as shown in FIG. 3. Thus, the circuit of FIG. 6 will be seen to bear the same relationship to the circuit of FIG. 3 that the circuits of FIGS. 4 and 5, respectively, bore to the circuits of FIGS. 1 and 2. It will be understood that a circuit of the type shown in FIG. 6 may also be coupled to transformer 14 by metallic connections across the primary or secondary winding as shown in FIGS. 3a and 3b.

In view of the foregoing, it will be seen that the compensated transformer circuit of the invention may be realized with either inductive or capacitive feedback elements and that such inductive or capacitive elements may be connected in the negative feedback path, the positive feedback path or the input feedback path. It will further be seen that each of the embodiments of the invention may be realized by connecting the capacitance simulating network to the transformer through a tertiary winding, by a metallic connection across the primary winding or by a metallic connection across the secondary winding.

Figure 7:
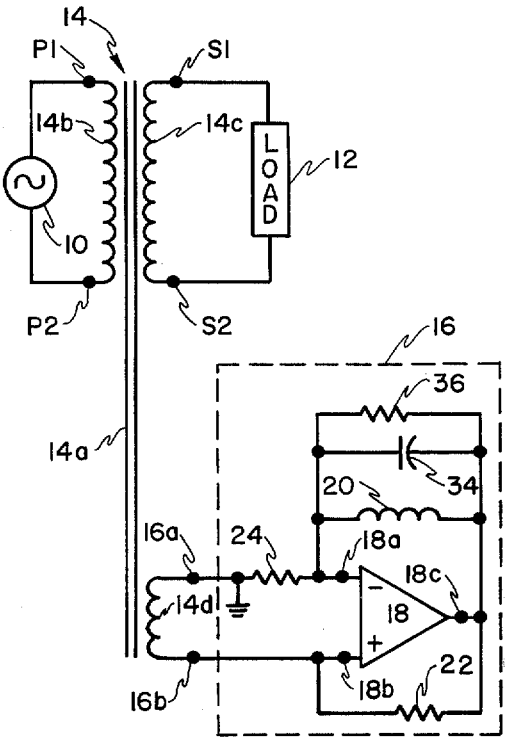
FIGS. 7, 8 and 9 are schematic diagrams of embodiments of the invention which include band-limiting circuitry for setting an upper frequency limit beyond which compensation does not occur.

To the end that the capacitance simulating activity of network 16 may be suppressed at frequencies above the band of frequencies within which capacitance cancellation is desired, there is provided herein bandlimiting circuit which is applicable to each of the previously described embodiments of the invention. Referring to FIG. 7, for example, there is shown a compensated transformer circuit of the type shown in FIG. 1 which includes a band-limiting network here shown as a capacitor 34 in parallel with a resistor 36. At the low and middle frequency regions of the desired band, capacitor 34 and resistor 36 have only a negligible effect and allow inductor 20 to cooperate with resistors 22 and 24 to produce the desired negative capacitance simulation. At frequencies beyond the high end of the desired band, however, the effect of capacitor 34 increases with frequency to cancel an increasing proportion of the capacitance simulating effect of inductor 20. This occurs because the reactance of capacitor 34 decreases with frequency and thereby causes overall impedance of the negative feedback path to decrease with frequency, even though the reactance of inductor 20 increases with frequency for frequencies beyond the desired transmission band. Thus, capacitor 34 reduces the magnitude of the simulated negative capacitance, as a function of frequency, for frequencies beyond the desired transmission band.

In order to stabilize capacitance simulating network 16 in the presence of the parallel resonance condition which arises between inductor 20 and capacitor 34, a resistor 36 may be connected in parallel with inductor 20 and capacitor 34. The effect of this resistor is to place an upper limit on the magnitude of the impedance of the negative feedback path and thereby limit the gain of amplifier 18. In other words, the resistor 36 may be said to "spoil the Q" of the tank circuit including inductor 20 and capacitor 34.

Figure 8:
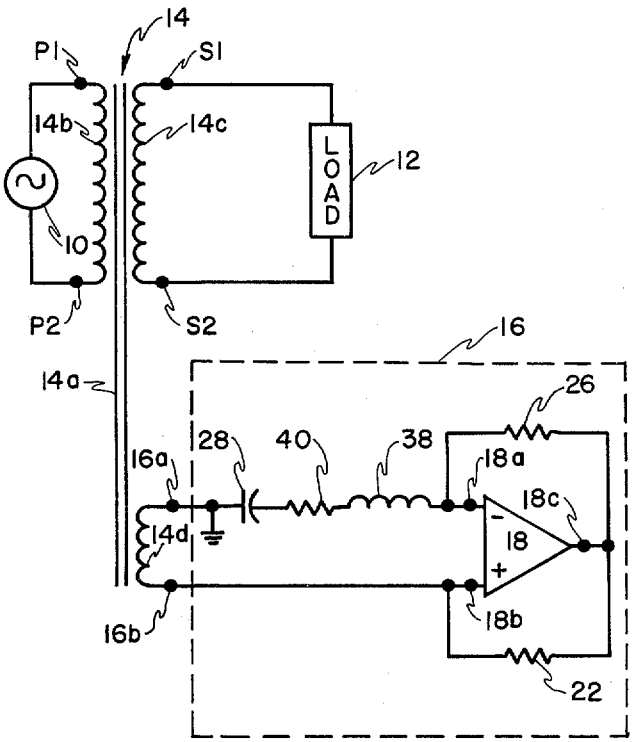

Referring to FIG. 8 there is shown a compensated transformer circuit of the type shown in FIG. 2 which includes a band-limiting network here shown as an inductor 38 and resistor 40. The latter elements are connected in series with input feedback capacitor 28 to cancel the capacitance simulating effect of capacitor 28 for frequencies beyond the upper end of the desired transmission band. This occurs because the reactance of inductor 38 increases with frequency and thereby causes the overall impedance of the input feedback path to increase with frequency, even though the reactance of capacitor 28 decreases with frequency for frequencies beyond the desired transmission band. Thus, inductor 38 decreases the magnitude of the simulated negative capacitance, as a function of frequency, for frequencies beyond the desired transmission band.

In order to stabilize capacitance simulating network 16 in the presence of a series resonant condition in capacitor 28 and inductor 38, as resistor 40 may be connected in series in the input impedance path. The effect of this resistor is to place a lower limit on the magnitude of the impedance of that branch and thereby limit the gain of amplifier 18. In other words, resistor 40 may be said to "spoil the Q" of the series resonant circuit including capacitor 28 and inductor 38.

Figure 9:
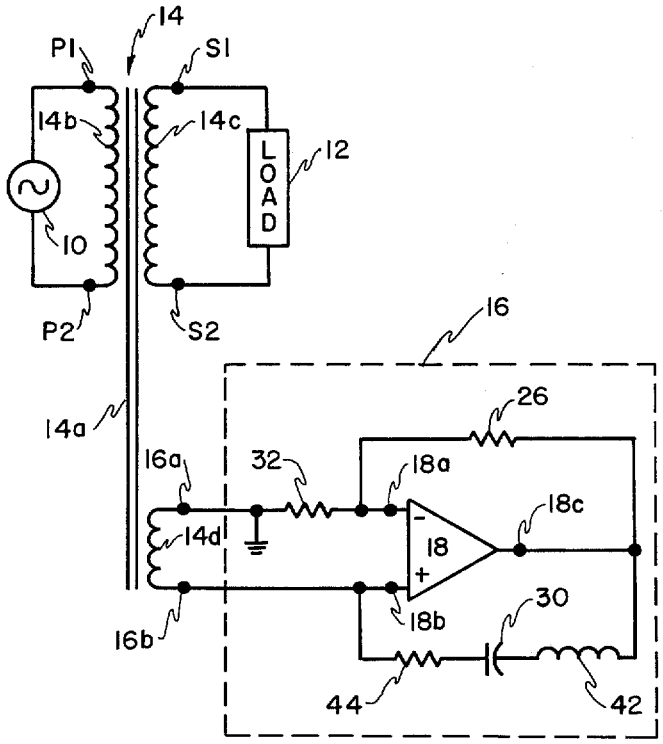

Referring to FIG. 9, there is shown a compensated transformer circuit of the type shown in FIG. 3 which includes a band-limiting circuitry here shown as an inductor 42 and a resistor 44. The latter elements are connected in series with capacitor 30 in the positive feedback path of amplifier 18. In this location, inductor 42 serves to cancel the capacitance simulating effect of capacitor 30 for frequencies beyond the upper end of the desired transmission band in a manner generally similar to that described in connection with FIGS. 7 and 8. As in the case of resistors 36 and 40 in FIG. 7 and 8, resistor 44 is provided to stabilize the response of the capacitance simulating network at frequencies near those at which capacitor 30 and inductor 42 approach a condition of resonance.

In view of the foregoing, it will be seen that the band-limiting circuitry of the invention may be applied in embodiments of the invention wherein a reactance is connected in the negative feedback path, in the positive feedback path or in the input feedback path. It will further be seen that the applicability of the band-limiting circuitry of the invention is unaffected by the manner in which the capacitance simulating circuitry is coupled to transformer 14, that is, whether the coupling is by means of a tertiary winding such as 14d or by metallic connections across the primary or secondary windings.

It will be understood that the embodiments shown herein are for illustrative purposes only and may be changed or modified without departing from the spirit and scope of the appended claims.

What is claimed is:

[1. A compensated transformer circuit comprising, in combination, a transformer including a primary and a secondary winding, capacitance simulating means for establishing voltages and currents which affect the circuitry to which said voltages and currents are applied as if a negative capacitance were connected to said circuitry, said negative capacitance having a magnitude substantially proportional to the stray capacitance of said transformer, and coupling means for coupling said capacitance simulating means to said transformer to substantially cancel the effect which said stray capacitance has on the voltages across and currents through said primary and secondary windings.]

[2. A compensated transformer circuit as set forth in claim 1 in which said coupling means comprises a tertiary winding in said transformer.]

[3. A compensated transformer circuit as set forth in claim 1 in which said coupling means includes means for connecting said capacitance simulating means across said primary winding.]

[4. A compensated transformer circuit as set forth in claim 1 in which said coupling means includes means for connecting said capacitance simulating means across said secondary winding.]

[5. A compensated transformer circuit as set forth in claim 1 including band-limiting means for placing an upper frequency limit on the band of frequencies within which said capacitance simulating means cancels said stray capacitance.]

[6. A compensated transformer circuit including, in combination, a transformer having a primary and a secondary winding, a capacitance simulating circuit comprising a plurality of terminals, an amplifier, a plurality of feedback elements and means for connecting said feedback elements to said amplifier to establish between said terminals an effective negative capacitance having a magnitude substantially proportional to the stray capacitance of said transformer, said compensated transformer circuit further including coupling means for coupling said terminals to said transformer to substantially cancel the effect which said stray capacitance has on the transformation of voltage and current in said transformer.]

[7. A compensated transformer circuit as set forth in claim 6 including band-limiting means for placing an upper frequency limit on the band of frequencies within which said capacitance simulating circuit cancels said stray capacitance.]

[8. A compensated transformer circuit as set forth in claim 6 in which said amplifier is an operational amplifier of the type which includes an inverting input, a non-inverting input and an output and in which said plurality of feedback elements includes a positive feedback impedance, a negative feedback impedance and an input feedback impedance.]

[9. A compensated transformer circuit as set forth in claim 8 wherein said input feedback impedance is connected to said inverting input.]

[10. A compensated transformer circuit as set forth in claim 8 wherein said input feedback impedance is connected to said noninverting input.]

[11. A compensated transformer circuit as set forth in claim 8 including band-limiting means for placing an upper frequency limit on the band of frequencies within which said capacitance simulating circuit cancels said stray capacitance.]

[12. A compensated transformer circuit as set forth in claim 8 wherein one of the feedback impedances comprises a reactance and wherein the remaining feedback impedances comprise resistors.]

[13. A compensated transformer circuit as set forth in claim 12 including band-limiting means for cancelling the effect of said reactance for frequencies beyond the band of frequencies within which the cancellation of stray capacitance is desirable.]

[14. A compensated transformer circuit as set forth in claim 8 wherein said negative feedback impedance comprises an inductor and wherein said positive and input feedback impedances comprise resistors.]

[15. A compensated transformer circuit as set forth in claim 8 wherein said input feedback impedance comprises a capacitor and wherein said positive and negative feedback impedances comprise resistors.]

[16. A compensated transformer circuit as set forth in claim 8 wherein said positive feedback impedance comprises a capacitor and wherein said negative and input feedback impedances comprise resistors.]

[17. A compensated transformer circuit as set forth in claim 8 wherein said positive feedback impedance comprises an inductor and wherein said input and negative feedback impedances comprise resistors.]

[18. A compensated transformer circuit as set forth in claim 8 wherein said negative feedback impedance comprises a capacitor and wherein said positive and input feedback impedances comprise resistors.]

*19. A transformer circuit which provides an uninterrupted path for the flow of primary and secondary current and which compensates for the frequency dependent attenuation of transformer signals that is introduced by the stray capacitance of the windings of the transformer comprising, in combination, a magnetic core, primary, secondary, and tertiary windings disposed on said core, an impedance simulating network including feedback circuitry for establishing voltages and currents which affect the circuitry to which said voltages and currents are applied as if a negative capacitance were connected to said circuitry, said negative capacitance having a magnitude substantially proportional to the stray capacitance of said transformer, and coupling means for coupling said impedance simulating network to said tertiary winding to effectively cancel the stray capacitance of said transformer.*

*20. A transformer circuit as set forth in claim 19 including band-limiting means for placing an upper fre-*

*quency limit on the band of frequencies within which said impedance simulating network cancels said stray capacitance.*

*21. A transformer circuit as set forth in claim 19 in which said impedance simulating network includes an operational amplifier having an inverting input, a non-inverting input and an output, a positive feedback impedance, a negative feedback impedance, and an input feedback impedance.*

*22. A transformer circuit as set forth in claim 21 wherein said input feedback impedance is connected to said inverting input.*

*23. A transformer circuit as set forth in claim 21 wherein said input feedback impedance is connected to said non-inverting input.*

*24. A transformer circuit as set forth in claim 21 wherein one of the feedback impedances comprises a reactance and wherein the remaining feedback impedances comprise resistors.*

*25. A transformer circuit as set forth in claim 21 wherein said negative feedback impedance comprises an inductor and wherein said positive and negative feedback impedances comprise resistors.*

*26. A transformer circuit as set forth in claim 21 wherein said input feedback impedance comprises a capacitor and wherein said positive and negative feedback impedances comprise resistors.*

*27. A transformer circuit as set forth in claim 21 wherein said positive feedback impedance comprises a capacitor and wherein said negative and input feedback impedances comprise resistors.*

*28. A transformer circuit as set forth in claim 21 wherein said positive feedback impedance comprises an inductor and wherein said input and negative feedback impedances comprise resistors.*

*29. A transformer circuit as set forth in claim 21 wherein said negative feedback impedance comprises a capacitor and wherein said positive and input feedback impedances comprise resistors.*

* * * * *